United States Patent [19]

Wu et al.

[11] Patent Number: 5,411,938
[45] Date of Patent: May 2, 1995

[54] SEALED GLASS COATING OF HIGH TEMPERATURE CERAMIC SUPERCONDUCTORS

[75] Inventors: Weite Wu, Tainan, Taiwan, Prov. of China; Cha Y. Chu, Garnerville, N.Y.; Kenneth C. Goretta, Downers Grove; Jules L. Routbort, Darien, both of Ill.

[73] Assignee: University of Chicago, Chicago, Ill.

[21] Appl. No.: 100,606

[22] Filed: Jul. 30, 1993

[51] Int. Cl.$^6$ .................. B05D 3/02; H01L 39/24
[52] U.S. Cl. .................... 505/430; 505/238; 505/704; 505/725; 427/62; 427/376.2; 427/443.2
[58] Field of Search .................. 505/1, 701, 702, 725, 505/704, 430, 238; 427/62, 376.2, 63, 443.2; 65/3.2; 428/930, 688; 174/125.1

[56] References Cited

U.S. PATENT DOCUMENTS

| | | | |
|---|---|---|---|
| 3,308,525 | 3/1967 | Tsuji et al. | 427/376.2 |
| 3,982,048 | 9/1976 | Zlupko | 427/376.2 |
| 4,044,173 | 8/1977 | Laurie | 427/376.2 |
| 4,378,409 | 3/1983 | Wahlers et al. | 427/376.2 |
| 5,006,671 | 4/1991 | Boeke | 505/1 |
| 5,093,311 | 3/1992 | Shiota et al. | 505/1 |

FOREIGN PATENT DOCUMENTS

5-074232  3/1993  Japan.

OTHER PUBLICATIONS

"Thermosetting epoxy as a moisture-resistant coating for YBa$_2$Cu$_3$O$_7$," De Guire et al., Journal of Materials Science, 25 (1990), 2881–2885.

"Reduced water degradation of YBaCuO by Si$_3$N$_4$ protective coating," Hahn et al., Journal of Materials Science Letters, 9 (1990), 967–969.

"Ceramic Superconducting Components," Haertling, Superconductivity II, vol. 18, 537–545 (1990).

"Disruption, Segregation, and Passivation for Pd and Noble-Metal Overlayers on YBa$_2$Cu$_3$O$_{6.9}$", T. Wagener et al., Physical Review B, vol. 38, No. 1, Jul. 1988, pp. 232–239.

"Diamondlike Carbon Films as Protective Coatings for Superconducting YBa$_2$Cu$_3$O$_7$ Films", L. Ganapathi, Appl. Phys. Lett. vol. 63, 1993, pp. 993–995.

"Environmental Reactivity Characteristics of Copper-Oxide Superconductors", Appl. Phys. Lett., vol. 63, 1993, pp. 548–550.

Primary Examiner—Roy V. King
Attorney, Agent, or Firm—Reinhart, Boerner, Van Deuren, Norris & Rieselbach

[57] ABSTRACT

A method and article of manufacture of a lead oxide based glass coating on a high temperature superconductor. The method includes preparing a dispersion of glass powders in a solution, applying the dispersion to the superconductor, drying the dispersion before applying another coating and heating the glass powder dispersion at temperatures below oxygen diffusion onset and above the glass melting point to form a continuous glass coating on the superconductor to establish compressive stresses which enhance the fracture strength of the superconductor.

14 Claims, 5 Drawing Sheets

SEALED GLASS COATING OF HIGH TEMPERATURE CERAMIC SUPERCONDUCTORS

The United States Government has rights in this invention pursuant to Contract W-31-109-ENG-38 between the U.S. Department of Energy and the University of Chicago.

The present invention is concerned generally with a method and coating for high temperature ceramic superconductors. More particularly, the invention is concerned with a method and glass coating applied to a ceramic superconductor at low temperatures to avoid chemical reaction with the superconductor material. The coated superconductor acts to enhance fracture strength and provide a moisture and environmental barrier for the superconductor. The methodology was tested successfully using one of the most reactive ceramic superconductors, $YBa_2Cu_3O_x$.

The high temperature ceramic superconductors have demonstrated the potential for many technological applications. However, as a consequence of being ceramic materials, physical properties which are unrelated to electrical conductivity make their applicability to practical problems questionable. For example, one of the primary deficiencies in metal oxide superconductors as applied to electrical power systems (for use in motors, power transmission and power storage) is the extremely brittle mechanical characteristics and sensitivity to flaws. Conventional solutions to this problem include: (a) manufacture of components with larger dimensions than needed for electrical purposes to minimize the chances of fracture during use, (b) encasing the ceramic superconductor components in surrounding protective housings, (c) forming a precursor metal structure having the desired final geometry and then performing complex oxidation treatments to achieve the final ceramic composition; this method avoids applying stresses to the ceramic, such as would occur in direct formation of a coil of ceramic superconductor wire; and (d) use of microstructural modifications, such as metal particles and high strength whisker phases dispersed in the ceramic superconductor. These methods all suffer from a variety of disadvantages associated with providing additional components and the necessity of performing complex chemical processing steps.

It is, therefore, an object of the invention to provide an improved method and coating for a ceramic superconductor.

It is another object of the invention to provide a novel method and glass coating for a ceramic superconductor.

It is a further object of the invention to provide an improved method and sealed glass coating for a ceramic superconductor wherein the glass coating is applied at low softening temperatures.

It is yet another object of the invention to provide a novel method and glass coating for ceramic superconductors which does not cause a chemical reaction and provides a passivating covering of the superconductor.

It is an additional object of the invention to provide an improved method and glass coating for ceramic superconductors resulting in substantially enhanced fracture strength for the superconductor.

It is still a further object of the invention to provide a method of applying a fireable glass dispersion to a ceramic superconductor allowing formation of a substantially complete glass coating on a ceramic superconductor.

These and other objects and advantages of the present invention will be readily apparent from the following description of the preferred embodiment thereof, taken in conjunction with the accompanying drawings and photographs set forth hereinbelow.

DETAILED DESCRIPTION OF PREFERRED EMBODIMENTS

Figure 1A:
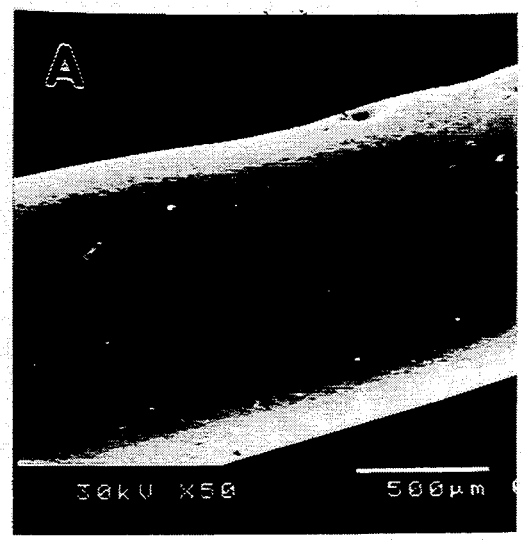
FIG. 1A shows a low magnification scanning electron microscope image of smooth coatings of Corning 7567 glass on ceramic superconductor wire.
Figure 1B:
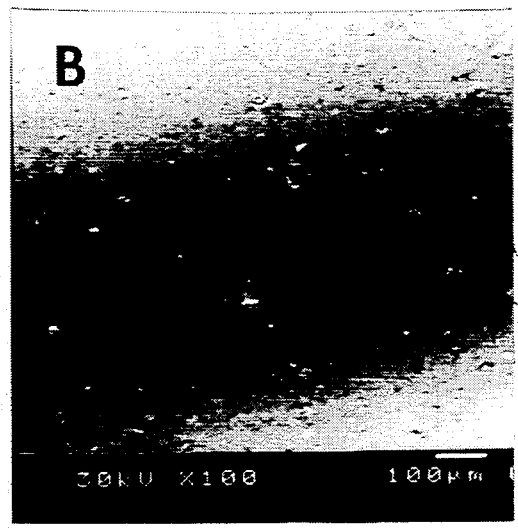
FIG. 1B shows a medium magnification image from the area in FIG. 1A.
Figure 1C:
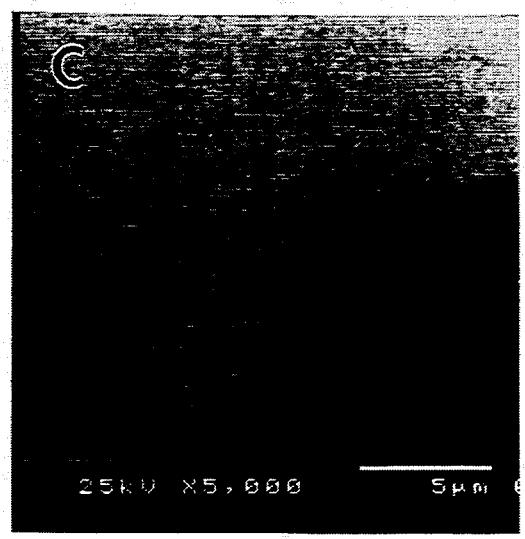
FIG. 1C shows a high magnification image from an area in FIGS. 1A and 1B.
Figure 2A:
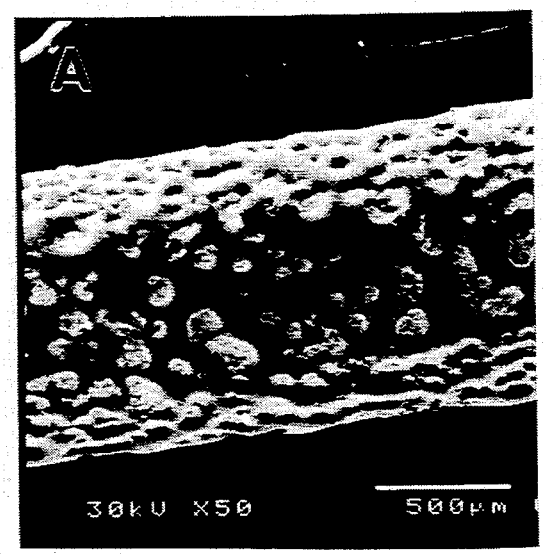
FIG. 2A shows a low magnification scanning electron microscope image of a discontinuous coating of Corning 7567 on ceramic superconductor wire.
Figure 2B:
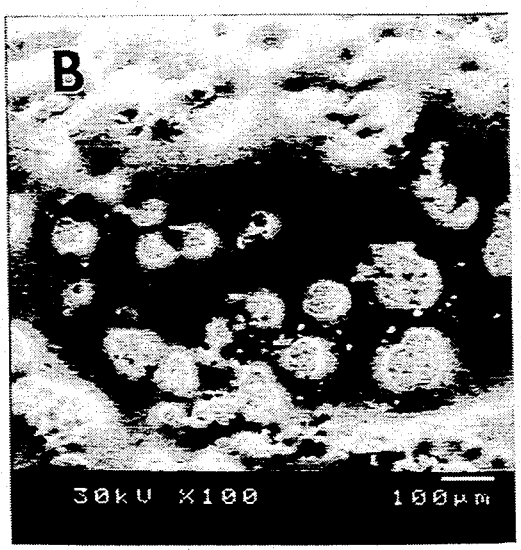
FIG. 2B shows a high magnification image from the same area in FIG. 2A.
Figure 3:
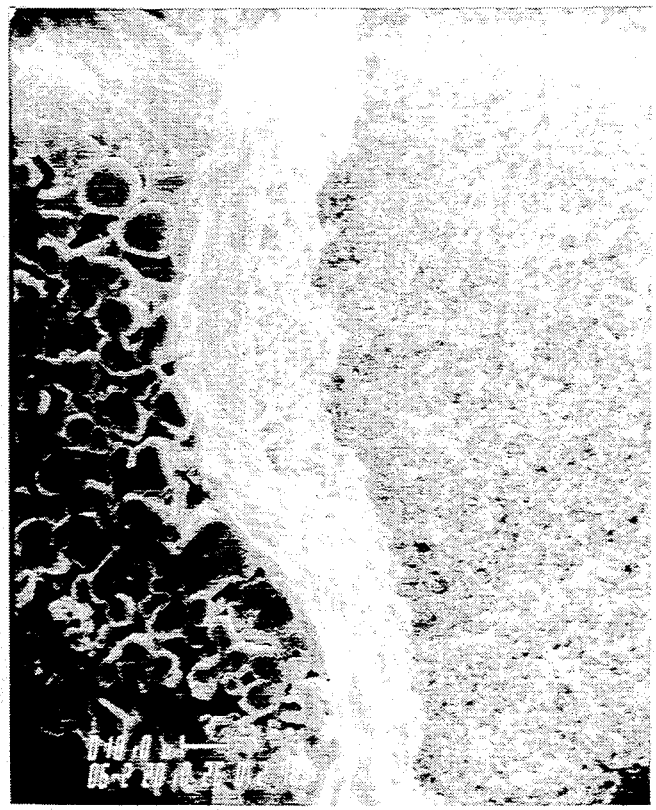
FIG. 3 illustrates a scanning electron microscope image of an interface between a glass coating of Vitrifunctions V-572 and ceramic superconductor wire (composite fired at 900° C.)
Figure 4:
FIG. 4 shows a scanning electron microscope image of an interface between a glass coating of Vitrifunctions V-572 and ceramic superconductor wire (composite fired at 800° C.)

A $YBa_2Cu_3O_x$ ceramic superconductor was selected for treatment in order to test one of the most reactive forms of the ceramic superconductors. For example, this class of superconductor is known to be much more sensitive to chemical effects than bismuth or thallium based ceramic superconductors. Therefore, the method and coatings were developed such that chemical reactions are minimized and a uniform coating achieved on the ceramic superconductor. Glass powders are dispersed in a medium, such as an organic solution or other suitably viscous (and chemically nonreactive) medium, which allows suspension of the glass powder. Subsequently, after applying the glass powder containing solution the dispersal medium can be removed, leaving a glass powder on the superconductor.

In order to achieve the desired increase in fracture toughness for the ceramic superconductor, it is highly preferred to have a compressive residual stress exerted on the surface of the ceramic superconductor. This can be achieved by selecting glass compositions which have coefficients of thermal expansion which are slightly less than the ceramic superconductor. Such glasses can, for example, include lead oxide (80%-95%), boron oxide (10%-20%), silicon dioxide (0.5%-1.5%), zinc oxide (0%-10%) and tin oxide (0%-5%).

In a preferred form of the invention, a stable dispersion of glass powders are therefore suspended in an organic solution which does not react with the ceramic superconductor. The powders in suspension can be applied to ceramic superconductor wires by dipping the wire into the glass/solution mixture. In other embodiments, the glass powder solution can be sprayed or painted onto the superconductor surfaces. After applying the glass powder solution to the superconductor, the volatile constituents can be easily removed by mild heating, such as at 100° C., between coatings being applied.

In order to form a bonded glass coating which is smooth and continuous and establishes a compressive residual stress on the superconductor surface, the dried coating is fired at temperatures of about 400° C. in an oxygen containing atmosphere for roughly 0.5-2 hours. Under these general conditions, oxygen loss from the superconductor is limited due to the slow diffusion of oxygen at such low temperature. Consequently, the fundamental superconducting properties will not be affected by unwanted chemical modifications of the superconductor. The superconducting transition temperature and sharpness of the superconducting transition were unaffected for the coated superconductor processed in accordance with the invention.

The resulting coated superconductors underwent fracture strength testing, and the level of strength increased substantially. Upon achieving a thickness of about 0.4 mm, the level of fracture strength was increased about four times the level of the uncoated ceramic superconductor.

The following nonlimiting example set forth procedures and results for coatings on $YBa_2Cu_3O_x$.

EXAMPLE I

Figure 5:
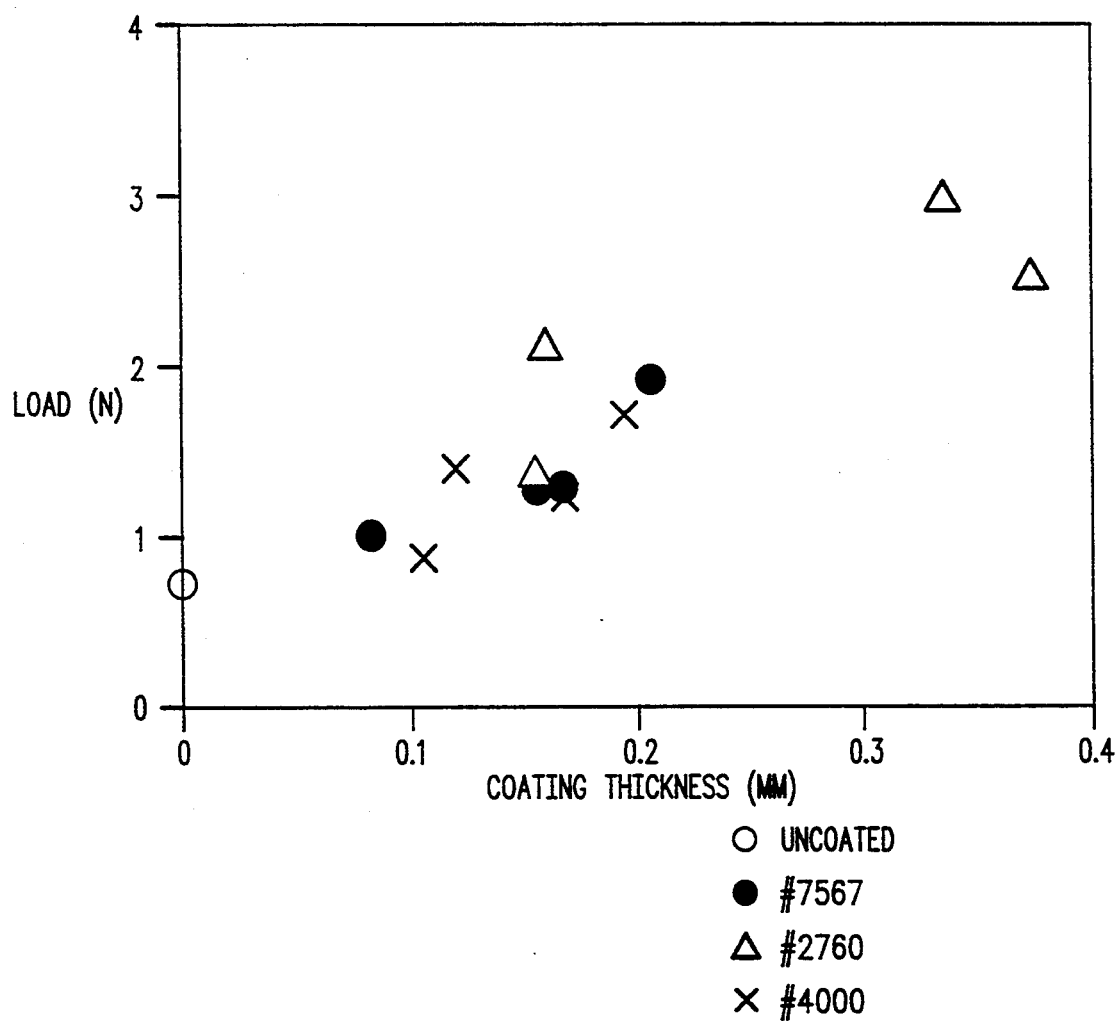
FIG. 5 illustrates a plot of fracture load versus thickness of a glass coating on a ceramic superconductor.

A Ferro Glass 2760 was obtained in powder form from Ferro Corp., Cleveland, Ohio. This glass and other examples described hereinafter have at least lead oxide (80-95%), boron oxide (10-20%), and silicon oxide (0.5-1.5%). Some also have zinc oxide (0-10%) and tin oxide (0-5%). The high lead content insures low softening points and high thermal expansion coefficients. This particular 2760 glass primarily is a lead oxide-zinc oxide-boron oxide-silicon oxide glass of approximately 44 micron mean particle size. These powders were dispersed in isopropyl alcohol with 50-80% glass powder by weight. The Glass 2760 has a softening point of 370° C. and a thermal expansion coefficient of $11.3 \times 10^{-6}$° $C.^{-1}$ compared to about $15 \times 10^{-6}$° $C.^{-1}$ for $YBa_2Cu_3O_x$. The powders were applied to $YBa_2Cu_3O_x$ wire (about 1000 microns wire diameter) by dipping in the glass powder solution and dried quickly at about 100° C. between or after being dipped. The dipped wire was then fired at about 400° C. in an oxygen atmosphere for about 0.5-2 hours to bond the coatings to the $YBa_2Cu_3O_x$ wire and form a continuous, smooth coating thereon. A number of different thickness coatings were obtained (depending on the number of times the wire was dipped or otherwise applied), and the resulting increase in fracture strength can be seen in FIG. 5. The fracture tests were based on a four-point bending method with the inner load span 13 mm and the outer load span 25 mm.

EXAMPLE II

Substantially the same procedure was followed as for Example I, but a Corning Glass 7567 was used as the starting glass powder. The 7567 is primarily a lead oxide-zinc oxide-boron oxide-silicon oxide of approximately 44 microns mean particle size. These powders were dispersed in xylene with 4-20% by weight rubber cement in 80-96% xylene and 50-80% by weight glass powder. The 7567 has a softening point of about 358° C. and a thermal expansion coefficient of $12.0 \times 10^{-6}$° $C.^{-1}$ compared to about $15 \times 10^{-6}$° $C.^{-1}$ for $YBa_2Cu_3O_x$. The 7567 was then fired at about 400°-410° C., and the resulting effect of the coatings can be seen in FIG. 5.

EXAMPLE III

Substantially the same procedure was followed as for Example I, but a Ferro Glass 4000 was used as the starting glass powders. The 4000 is primarily a lead oxide-boron oxide-silicon oxide glass of 44 micron mean particle size. These powders were dispersed in isopropyl alcohol with 50-80% glass powder by weight. The 4000 glass has a softening point of about 360° C. and a coefficient of thermal expansion of $8.1 \times 10^{-6}$° $C.^{-1}$ compared to about $15 \times 10^{-6}$° $C.^{-1}$ $YBa_2Cu_3O_x$.

The invention therefore allows achievement of an increase of about four times the fracture strength of an uncoated ceramic superconductor without affecting the superconducting properties (the transition temperature remained the same and the transition was sharp). This approach does not degrade the chemical structure of highly reactive $YBa_2Cu_3O_x$, and thus the technique is equally applicable to other ceramic superconductors. The glass coating further acts as an environmental barrier and thermal barrier to heat loss when needed (such as for temperature sensors).

While preferred embodiments of the invention have been shown and described, it will be clear to those skilled in the art that various changes and modifications can be made without departing from the invention in its broader aspects as set forth in the claims provided hereinafter.

What is claimed is:

1. A method of manufacturing a coated, high temperature 123 YBaCuO superconductor, comprising the steps of:

providing a 123 YBaCuO superconductor article;
   applying the suspension of said glass powders to form a dispersion of said glass powders on said high temperature 123 YBaCuO superconductor article;
   heating said dispersion of said glass powders causing melting and formation of a lead oxide based continuous glass coating on said high temperature 123 YBaCuO superconductor article; and
   cooling said melted lead oxide based continuous glass coating forming a solid glass coating on said superconductor article and formation of compressive stresses on said 123 YBaCuO superconductor article.

2. The method as defined in claim 1 wherein said lead oxide based glass coating comprises 80-95 wt. % lead oxide and further includes about 12-20 wt. % boron oxide and less than 2 wt. % $SiO_2$.

3. The method as defined in claim 1 wherein said lead oxide based glass coating has a coefficient of thermal expansion less than said high temperature 123 YBaCuO superconductor.

4. The method as defined in claim 3 wherein the coefficient of thermal expansion of said lead oxide based glass coating is about fifty to eighty percent of said high temperature 123 YBaCuO superconductor.

5. The method as defined in claim 4 wherein said lead oxide based glass coating is selected from the group consisting of a lead-zinc-boron-silica glass, a lead-boron-silica glass and a lead-zinc-fin-boron-silica glass.

6. The method as defined in claim 1 wherein said solution of said suspension comprises an organic solution.

7. The method as defined in claim 1 wherein said heating step is performed in an oxygen containing atmosphere.

8. The method as defined in claim 1 wherein said step of applying the suspension comprises applying a plurality of coatings and drying said coatings before applying another coating.

9. The method as defined in claim 1 wherein said article comprises a wire.

10. A method of manufacturing a coated high temperature 123 YBaCuO superconductor, comprising the steps of:

provifing a high temperature 123 YBaCuO superconductor wire;

preparing a suspension of glass powders in an organic solution, said glass powders consisting essentially of glasses having a lead oxide base of at least 80 wt. %;

covering said wire with a coating of said dispersion of glass powders;

drying said coating before applying another coating to said wire; and heating said wire and said coating above the melting point of said coating of said glass powders to form a solid, continuous coating of glass on said wire with said glass coating having a coefficient of thermal expansion less than said high temperature superconductor, said continuous solid coating causing compressive residual stresses on said wire.

11. The method as defined in claim 10 wherein said step of heating said wire is performed at a temperature such that oxygen diffusion in said wire does not cause change of the superconductor wire critical temperature.

12. The method as defined in claim 11 wherein said temperature of heating is less than about 410° C.

13. The method as defined in claim 10 wherein said heating step is performed in an oxygen containing atmosphere.

14. The method as defined in claim 10 wherein the coefficient of thermal expansion of said glass coating is less than eighty percent of that of said high temperature superconductor.

* * * * *